United States Patent
Yan et al.

(10) Patent No.: US 8,188,824 B2
(45) Date of Patent: May 29, 2012

(54) SURFACE MOUNT MAGNETIC COMPONENTS AND METHODS OF MANUFACTURING THE SAME

(75) Inventors: Yipeng Yan, Shanghai (CN); Robert James Bogert, Lake Worth, FL (US)

(73) Assignee: Cooper Technologies Company, Houston, TX (US)

( * ) Notice: Subject to any disclaimer, the term of this patent is extended or adjusted under 35 U.S.C. 154(b) by 68 days.

(21) Appl. No.: 12/765,056

(22) Filed: Apr. 22, 2010

(65) Prior Publication Data
US 2010/0271162 A1  Oct. 28, 2010

Related U.S. Application Data

(63) Continuation-in-part of application No. 12/429,856, filed on Apr. 24, 2009, now Pat. No. 7,986,208.

(60) Provisional application No. 61/175,269, filed on May 4, 2009, provisional application No. 61/080,115, filed on Jul. 11, 2008.

(51) Int. Cl.
    *H01F 27/29* (2006.01)
(52) U.S. Cl. ........................................... 336/192
(58) Field of Classification Search ............... 336/65, 336/83, 192, 200, 232
See application file for complete search history.

(56) References Cited

U.S. PATENT DOCUMENTS

| 5,912,609 | A | 6/1999 | Usui et al. |
| 6,198,375 | B1 * | 3/2001 | Shafer ........................... 336/225 |
| 6,392,525 | B1 | 5/2002 | Kato et al. |
| 7,327,212 | B2 * | 2/2008 | Sano et al. ..................... 336/83 |
| 2008/0310051 | A1 | 12/2008 | Yan et al. |
| 2009/0058588 | A1 | 3/2009 | Suzuki et al. |
| 2010/0007451 | A1 | 1/2010 | Yan et al. |
| 2010/0007453 | A1 | 1/2010 | Yan et al. |
| 2010/0013587 | A1 | 1/2010 | Yan et al. |

FOREIGN PATENT DOCUMENTS

| EP | 1526556 A1 | 4/2005 |
| JP | 05291046 | 11/1993 |
| JP | 07220970 A * | 8/1995 |
| JP | 03241711 | 2/1999 |
| WO | 0191141 A1 | 11/2001 |
| WO | 2008008538 A2 | 1/2008 |

OTHER PUBLICATIONS

International Search Report and Written Opinion of PCT/US2010/032798; Aug. 20, 2010; 15 pages.
International Search Report and Written Opinion of PCT/US2010/031886; Aug. 18, 2010; 14 pages.
International Search Report and Written Opinion of PCT/US2010/032517; Aug. 12, 2010; 16 pages.

* cited by examiner

*Primary Examiner* — Tuyen Nguyen
(74) *Attorney, Agent, or Firm* — Armstrong Teasdale LLP

(57) ABSTRACT

Magnetic component assemblies including moldable magnetic materials including surface mount termination features, as well as manufacturing methods therefor, are disclosed that are advantageously utilized in providing surface mount magnetic components such as inductors and transformers.

26 Claims, 12 Drawing Sheets

SURFACE MOUNT MAGNETIC COMPONENTS AND METHODS OF MANUFACTURING THE SAME

CROSS REFERENCE TO RELATED APPLICATIONS

This applications claims the benefit of U.S. Provisional Application Ser. Nos. 61/175,269 filed May 4, 2009 and 61/080,115 filed Jul. 11, 2008, and is a continuation in part application of U.S. application Ser. No. 12/429,856 filed Apr. 24, 2009, now U.S. Pat. No. 7,986,208, the complete disclosures of which are hereby incorporated by reference in their entirety.

The present application also relates to subject matter disclosed in the following commonly owned and co-pending patent applications: U.S. patent application Ser. No. 12/247,281 filed on Oct. 8, 2008 and entitled "High Current Amorphous Powder Core Inductor"; U.S. patent Ser. No. 12/181,436 filed Jul. 29, 2008 and entitled "A Magnetic Electrical Device"; U.S. Provisional Patent Application No. 61/080,115 filed Jul. 11, 2008 and entitled "High Performance High Current Power Inductor", and U.S. patent application Ser. No. 12/138,792 filed Jun. 13, 2008 and entitled "Miniature Shielded Magnetic Component"; and U.S. patent application Ser. No. 11/519,349 filed Jun. Sep. 12, 2006 and entitled "Low Profile Layered Coil and Cores for Magnetic Components".

BACKGROUND OF THE INVENTION

The field of the invention relates generally to magnetic components and their manufacture, and more specifically to magnetic, surface mount electronic components such as inductors and transformers.

With advancements in electronic packaging, the manufacture of smaller, yet more powerful, electronic devices has become possible. To reduce an overall size of such devices, electronic components used to manufacture them have become increasingly miniaturized. Manufacturing electronic components to meet such requirements presents many difficulties, thereby making manufacturing processes more expensive, and undesirably increasing the cost of the electronic components.

Manufacturing processes for magnetic components such as inductors and transformers, like other components, have been scrutinized as a way to reduce costs in the highly competitive electronics manufacturing business. Reduction of manufacturing costs is particularly desirable when the components being manufactured are low cost, high volume components. In high volume, mass production processes for such components, and also electronic devices utilizing the components, any reduction in manufacturing costs is, of course, significant.

BRIEF DESCRIPTION OF THE INVENTION

Exemplary embodiments of magnetic component assemblies and methods of manufacturing the assemblies are disclosed herein that are advantageously utilized to achieve one or more of the following benefits: component structures that are more amenable to produce at a miniaturized level; component structures that are more easily assembled at a miniaturized level; component structures that allow for elimination of manufacturing steps common to known magnetic constructions; component structures having an increased reliability via more effective manufacturing techniques; component structures having improved performance in similar or reduced package sizes compared to existing magnetic components; component structures having increased power capability compared to conventional, miniaturized, magnetic components; and component structures having unique core and coil constructions offering distinct performance advantages relative to known magnetic component constructions.

The exemplary component assemblies are believed to be particularly advantageous to construct inductors and transformers, for example. The assemblies may be reliably provided in small package sizes and may include surface mount features for ease of installation to circuit boards.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIGS. 11A through 11H illustrate manufacturing steps utilizing the terminal assembly shown in FIGS. 9 and 10; wherein:

FIG. 11A represents a first stage of manufacture of a magnetic component;

FIG. 11B represents a second stage of the manufacture of the magnetic component;

FIG. 11C illustrates a top view of the resultant assembly from FIG. 11B;

FIG. 11D illustrates a bottom view of the resultant assembly from FIG. 11B;

FIG. 11E represents a third stage of manufacture of the magnetic component;

FIG. 11F represents a fourth stage of manufacture of the magnetic component;

FIG. 11G represents a fifth stage of manufacture of the magnetic component.

FIG. 11H shows the completed magnetic component.

DETAILED DESCRIPTION OF THE INVENTION

Figure 1:
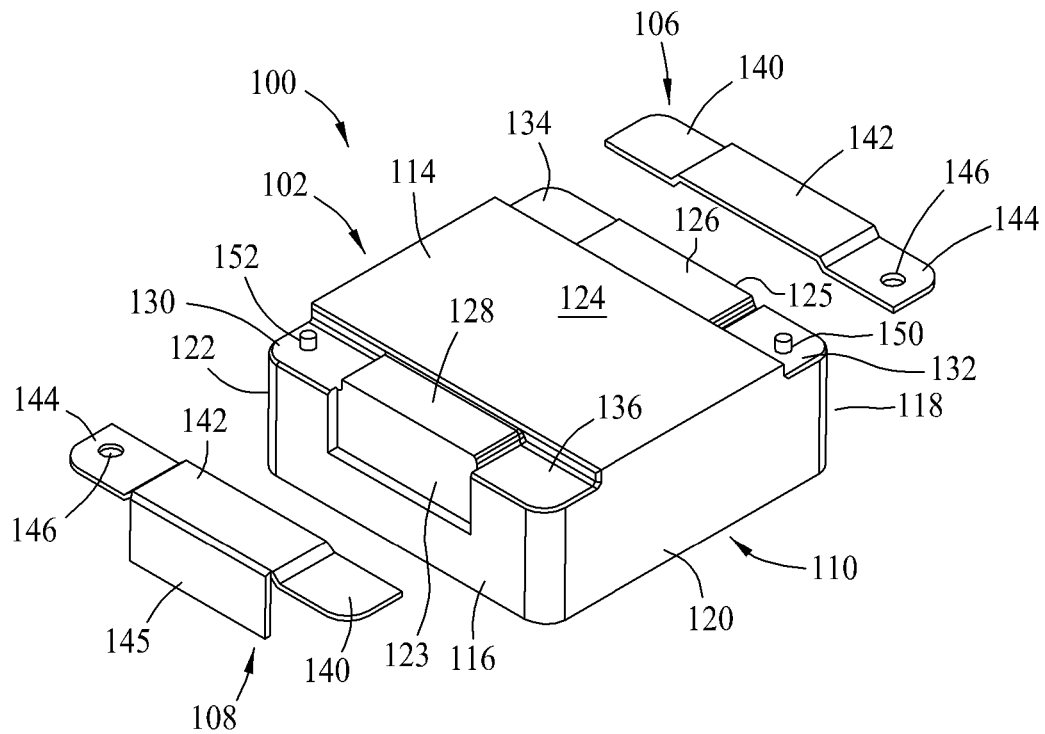
FIG. 1 is a partial exploded view of an exemplary surface mount magnetic component according to an exemplary embodiment of the invention.

Exemplary embodiments of inventive electronic component designs are described herein that overcome numerous difficulties in the art. To understand the invention to its fullest extent, the following disclosure is presented in different segments or parts, wherein Part I discusses particular problems and difficulties, and Part II describes exemplary component constructions and assemblies for overcoming such problems.

I. INTRODUCTION TO THE INVENTION

Conventional magnetic components such as inductors for circuit board applications typically include a magnetic core and a conductive winding, sometimes referred to as a coil, within the core. The core may be fabricated from discrete core pieces fabricated from magnetic material with the winding placed between the core pieces. Various shapes and types of core pieces and assemblies are familiar to those in the art, including but not necessarily limited to U core and I core assemblies, ER core and I core assemblies, ER core and ER core assemblies, a pot core and T core assemblies, and other matching shapes. The discrete core pieces may be bonded together with an adhesive and typically are physically spaced or gapped from one another.

In some known components, for example, the coils are fabricated from a conductive wire that is wound around the core or a terminal clip. That is, the wire may be wrapped around a core piece, sometimes referred to as a drum core or other bobbin core, after the core pieces has been completely formed. Each free end of the coil may be referred to as a lead and may be used for coupling the inductor to an electrical circuit, either via direct attachment to a circuit board or via an indirect connection through a terminal clip. Especially for small core pieces, winding the coil in a cost effective and reliable manner is challenging. Hand wound components tend to be inconsistent in their performance. The shape of the core pieces renders them quite fragile and prone to core cracking as the coil is wound, and variation in the gaps between the core pieces can produce undesirable variation in component performance. A further difficulty is that the DC resistance ("DCR") may undesirably vary due to uneven winding and tension during the winding process.

In other known components, the coils of known surface mount magnetic components are typically separately fabricated from the core pieces and later assembled with the core pieces. That is, the coils are sometimes referred to as being pre-formed or pre-wound to avoid issues attributable to hand winding of the coil and to simplify the assembly of the magnetic components. Such pre-formed coils are especially advantageous for small component sizes.

In order to make electrical connection to the coils when the magnetic components are surface mounted on a circuit board, conductive terminals or clips are typically provided. The clips are assembled on the shaped core pieces and are electrically connected to the respective ends of the coil. The terminal clips typically include generally flat and planar regions that may be electrically connected to conductive traces and pads on a circuit board using, for example, known soldering techniques. When so connected and when the circuit board is energized, electrical current may flow from the circuit board to one of the terminal clips, through the coil to the other of the terminal clips, and back to the circuit board. In the case of an inductor, current flow through the coil induces magnetic fields and energy in the magnetic core. More than one coil may be provided.

In the case of a transformer, a primary coil and a secondary coil are provided, wherein current flow through the primary coil induces current flow in the secondary coil. The manufacture of transformer components presents similar challenges as inductor components.

For increasingly miniaturized components, providing physically gapped cores is challenging. Establishing and maintaining consistent gap sizes is difficult to reliably accomplish in a cost effective manner.

A number of practical issues are also presented with regard to making the electrical connection between the coils and the terminal clips in miniaturized, surface mount magnetic components. A rather fragile connection between the coil and terminal clips is typically made external to the core and is consequently vulnerable to separation. In some cases, it is known to wrap the ends of coil around a portion of the clips to ensure a reliable mechanical and electrical connection between the coil and the clips. This has proven tedious, however, from a manufacturing perspective and easier and quicker termination solutions would be desirable. Additionally, wrapping of the coil ends is not practical for certain types of coils, such as coils having rectangular cross section with flat surfaces that are not as flexible as thin, round wire constructions.

As electronic devices continue recent trends of becoming increasingly powerful, magnetic components such as inductors are also required to conduct increasing amounts of current. As a result the wire gauge used to manufacture the coils is typically increased. Because of the increased size of the wire used to fabricate the coil, when round wire is used to fabricate the coil the ends are typically flattened to a suitable thickness and width to satisfactorily make the mechanical and electrical connection to the terminal clips using for example, soldering, welding, or conductive adhesives and the like. The larger the wire gauge, however, the more difficult it is to flatten the ends of the coil to suitably connect them to the terminal clips. Such difficulties have resulted in inconsistent connections between the coil and the terminal clips that can lead to undesirable performance issues and variation for the magnetic components in use. Reducing such variation has proven very difficult and costly.

Fabricating the coils from flat, rather than round conductors may alleviate such issues for certain applications, but flat conductors tend to be more rigid and more difficult to form into the coils in the first instance and thus introduce other manufacturing issues. The use of flat, as opposed to round, conductors can also alter the performance of the component in use, sometimes undesirably. Additionally, in some known constructions, particularly those including coils fabricated from flat conductors, termination features such as hooks or other structural features may be formed into the ends of the coil to facilitate connections to the terminal clips. Forming such features into the ends of the coils, however, can introduce further expenses in the manufacturing process.

Recent trends to reduce the size, yet increase the power and capabilities of electronic devices present still further challenges. As the size of electronic devices are decreased, the size of the electronic components utilized in them must accordingly be reduced, and hence efforts have been directed to economically manufacture power inductors and transformers having relatively small, sometimes miniaturized, structures despite carrying an increased amount of electrical current to power the device. The magnetic core structures are desirably provided with lower and lower profiles relative to circuit boards to allow slim and sometimes very thin profiles of the electrical devices. Meeting such requirement presents still further difficulties. Still other difficulties are presented for components that are connected to multi-phase electrical power systems, wherein accommodating different phases of electrical power in a miniaturized device is difficult.

Efforts to optimize the footprint and the profile of magnetic components are of great interest to component manufacturers looking to meet the dimensional requirements of modern electronic devices. Each component on a circuit board may be generally defined by a perpendicular width and depth dimension measured in a plane parallel to the circuit board, the product of the width and depth determining the surface area occupied by the component on the circuit board, sometimes referred to as the "footprint" of the component. On the other hand, the overall height of the component, measured in a direction that is normal or perpendicular to the circuit board, is sometimes referred to as the "profile" of the component. The footprint of the components in part determines how many components may be installed on a circuit board, and the profile in part determines the spacing allowed between parallel circuit boards in the electronic device. Smaller electronic devices generally require more components to be installed on each circuit board present, a reduced clearance between adjacent circuit boards, or both.

However, many known terminal clips used with magnetic components have a tendency to increase the footprint and/or the profile of the component when surface mounted to a circuit board. That is, the clips tend to extend the depth, width and/or height of the components when mounted to a circuit board and undesirably increase the footprint and/or profile of the component. Particularly for clips that are fitted over the external surfaces of the magnetic core pieces at the top, bottom or side portions of the core, the footprint and/or profile of the completed component may be extended by the terminal clips. Even if the extension of the component profile or height is relatively small, the consequences can be substantial as the number of components and circuit boards increases in any given electronic device.

II. EXEMPLARY INVENTIVE MAGNETIC COMPONENT ASSEMBLIES AND METHODS OF MANUFACTURE

Exemplary embodiments of magnetic component assemblies will now be discussed that address some of the problems of conventional magnetic components in the art. Manufacturing steps associated with the devices described are in part apparent and in part specifically described below. Likewise, devices associated with method steps described are in part apparent and in part explicitly described below. That is the devices and methodology of the invention will not necessarily be separately described in the discussion below, but are believed to be well within the purview of those in the art without further explanation.

Figure 2:
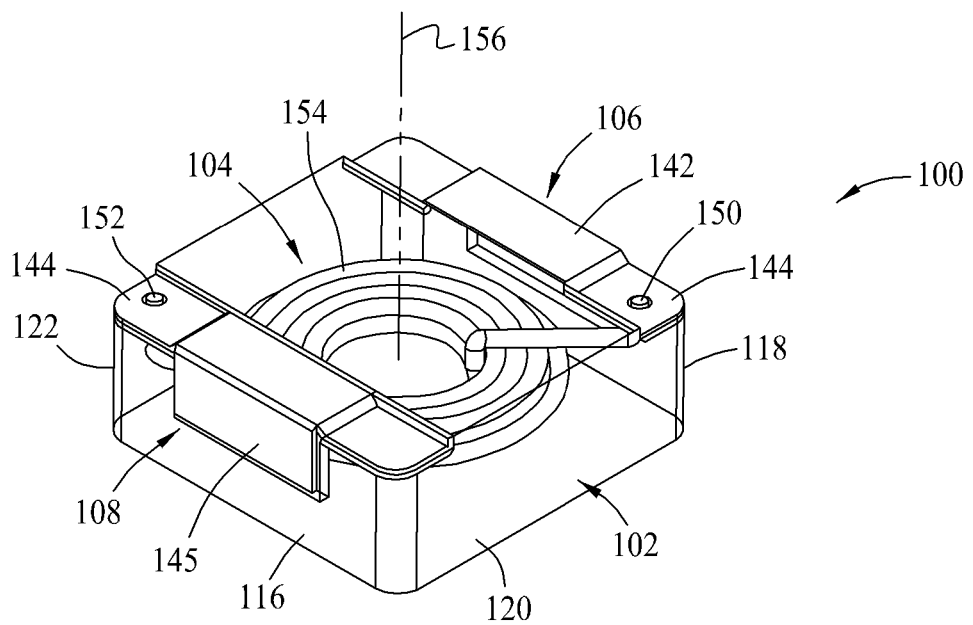
FIG. 2 is a top perspective schematic view of the magnetic component shown in FIG. 1.
Figure 3:
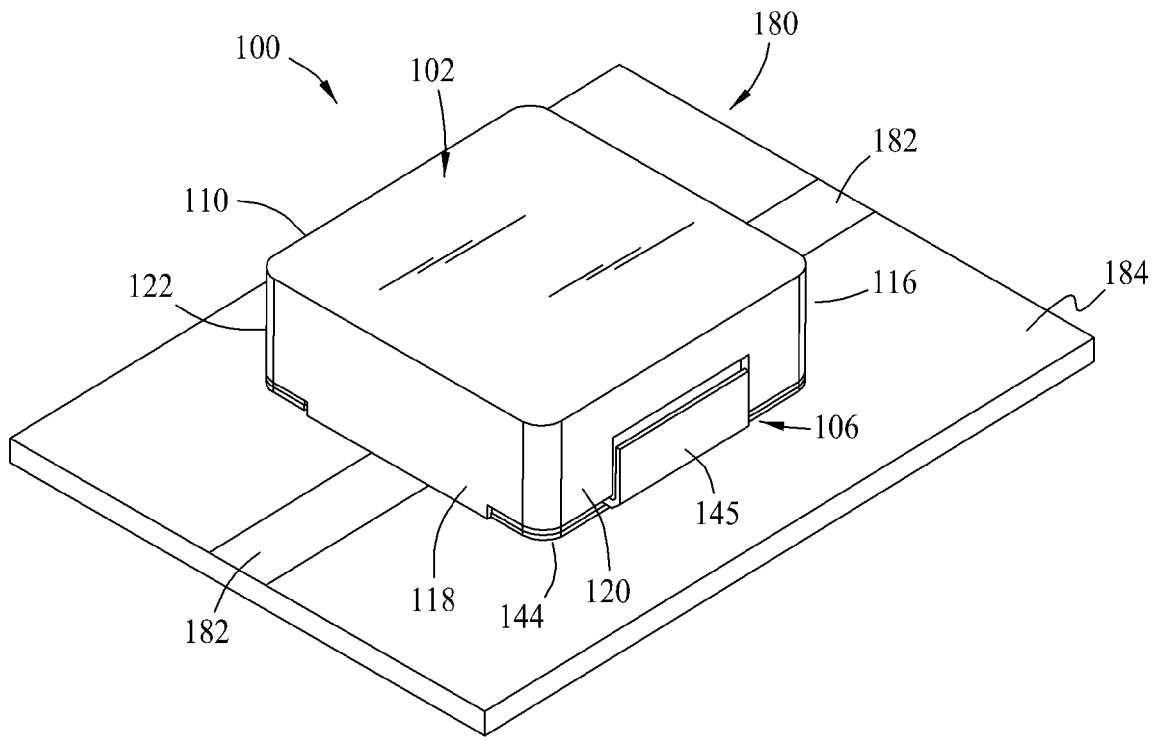
FIG. 3 is a top perspective assembly view of the magnetic component shown in FIG. 1.
Figure 4:
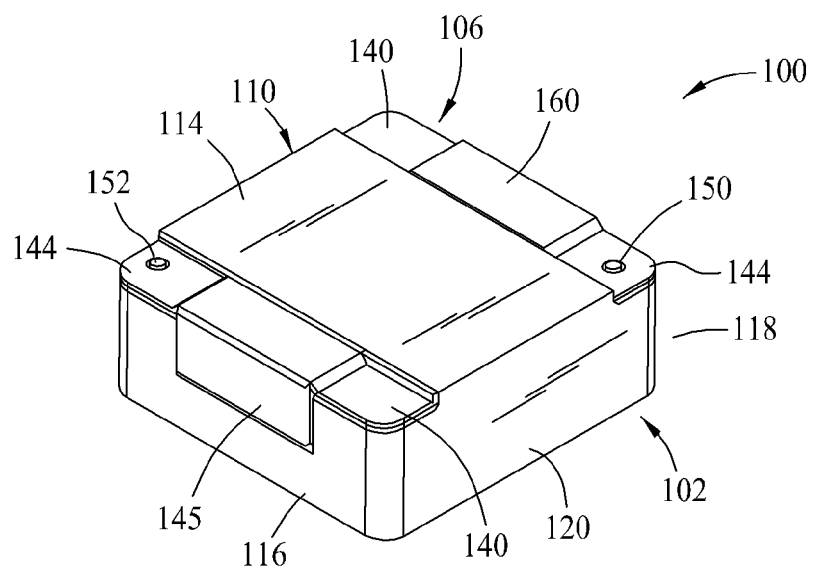
FIG. 4 is a bottom perspective assembly view of the magnetic component shown in FIG. 1.

FIGS. 1-4 are various views of an exemplary surface mount magnetic component 100 according to an exemplary embodiment of the invention. More specifically, FIG. 1 is a partial exploded view of a the surface mount magnetic component 100, FIG. 2 is a top perspective schematic view of the magnetic component 100, FIG. 3 is a top perspective assembly view of the magnetic component 100, and FIG. 4 is a bottom perspective assembly view of the magnetic component 100.

The component 100 generally includes a magnetic core 102, a coil 104 generally contained in the core 102, and terminal clips 106, 108. In the exemplary embodiment shown in FIGS. 1-4, the core 102 is fabricated in a single piece 110, although in another embodiment the core 102 may include more than one core piece if desired, with the core pieced being physically gapped from one another when assembled.

The core piece 110 may be fabricated as an integral piece using, for example, iron powder materials or amorphous core materials, also known in the art, that may be pressed around the coil 104. Such iron powder materials and amorphous core materials may exhibit distributed gap properties that avoid any need for a physical gap in the core structure. In one exemplary embodiment, the single core piece 110 for the component 100 may be fabricated from a magnetic powder material familiar to those in the art, and the material may be pressed or compressed around a coil 104 to form an integral core and coil construction.

In a further and/or alternative embodiment, the core piece 110 may be formed from layers or sheets of magnetic powder material that are stacked and pressed around the coil 104. Exemplary magnetic powder particles to fabricate such layers or sheets may include Ferrite particles, Iron (Fe) particles, Sendust (Fe—Si—Al) particles, MPP (Ni—Mo—Fe) particles, HighFlux (Ni—Fe) particles, Megaflux (Fe—Si Alloy) particles, iron-based amorphous powder particles, cobalt-based amorphous powder particles, or other equivalent materials known in the art. When such magnetic powder particles are mixed with a polymeric binder material the resultant magnetic material exhibits distributed gap properties that avoids any need to physically gap or separate different pieces of magnetic materials. As such, difficulties and expenses associated with establishing and maintaining consistent physical gap sizes are advantageously avoided. For high current applications, a pre-annealed magnetic amorphous metal powder combined with a polymer binder may be advantageous.

The coil 104, best seen in FIG. 2, is fabricated from a length of round wire and includes a first distal end or lead 150, a second distal end or lead 152 opposing the first end, and a winding portion 154 between the coil ends 150 and 152 wherein the wire is wound about a coil axis 156 for a number of turns to achieve a desired effect, such as, for example, a desired inductance value for a selected end use application of the component 100. Additionally, the coil is wound in both a helical manner along the axis 156 and spiral form relative to the axis 156 to provide a more compact coil design to meet low profile requirements while still providing a desired inductance value. The ends 150, 152 are bent relative to the winding portion 154 so that the ends extend parallel to the coil axis 156 to facilitate termination of the coil ends 150, 152 as explained below.

If desired, the wire used to form the coil 104 may be coated with enamel coatings and the like to improve structural and functional aspects of coil 104. As those in the art will appreciate, an inductance value of coil 104, in part, depends upon wire type, a number of turns of wire in the coil, and wire diameter. As such, inductance ratings of the coil 104 may be varied considerably for different applications. The coil 104 may be fabricated independently from the core pieces 110 using known techniques and may be provided as a pre-wound structure for assembly of the component 100. In an exemplary embodiment, the coil 104 is formed in an automated manner to provide consistent inductance values for the finished coils, although alternatively the coils may be wound by hand if desired. It is understood that if more than one coil is provide, additional terminal clips may likewise be required to make electrical connections to all of the coils utilized.

The coil 104 is exemplary only and it is understood that other types of coils may alternatively be utilized. For example, flat conductors could be used to fabricated a coil instead of the round wires illustrated in FIG. 2. Additionally, the winding portion 154 may assume various alternative shapes and configurations, including but not limited to helical or spiral configurations (but not both as shown in FIG. 2), and winding portion configurations having straight, polygonal sections instead of curved sections (e.g., serpentine shapes, C-shapes, etc.). Likewise, more than one coil may be utilized if desired.

As shown in the illustrated embodiment, the core piece 110 is formed into a generally rectangular body having a base wall 114 and a plurality of generally orthogonal side walls 116, 118, 120 and 122 extending from the lateral edges of the base wall 114. In the embodiment shown in FIGS. 1-4, the base wall 114 may sometimes be referred to as a bottom wall. The side walls 116 and 118 oppose one another and may sometimes be referred to as a left side a right side, respectively. The walls 120 and 122 oppose one another and may sometimes be referred to as a front side a rear side, respectively. The side walls 116, 118, 120 and 122 define an enclosure or cavity above the base wall 114 that generally contains the coil 104 when the component is assembled.

As also shown in FIG. 1, the side wall 116 of the first core piece 110 also includes a depressed surface 123, and the opposing side wall 118 includes a corresponding depressed surface 125. The depressed surfaces 123 and 125 extend only a partial distance along a length of the respective side walls 116 and 118. The depressed surfaces 123 and 125 also extend upward from the base wall 114 for a distance less than the height of the side walls 116 and 118 measured in a direction perpendicular to the bottom surface. As such, the depressed surfaces 123 and 125 are spaced from top edges of the side walls 116 and 118 while adjoining the depressed surfaces 126 and 128 of the base wall 114 for a portion of the length of the side walls 116 and 118 extending adjacent the base wall 114.

The external surface of the base wall 114 of the core piece 110 is contoured and includes a non-depressed surface 124 separating first and second depressed surfaces 126 and 128. The depressed surfaces 126 and 128 extend on opposing sides of the non-depressed surface 124. Third and fourth depressed surfaces 130 and 132 are also provided on opposing corners of the base wall 114. Fifth and sixth depressed surfaces 134, 136 oppose the third and fourth depressed surfaces 130 and 132 on the remaining corners of the core piece 110. In the illustrated embodiment, the fifth and sixth depressed surfaces 134, 136 extend in a generally coplanar relationship to one another, and also in a generally coplanar relationship to the third and fourth depressed surfaces 130 and 132. Thus, the base wall 114 is stepped with three levels of surfaces, with the first level being the non-depressed surface 124, the second level being the depressed surfaces 126 and 128 spaced from the first level by a first amount, and the third level being the depressed surfaces 130, 132, 134, 136 spaced from each of the first and second levels. The depressed surfaces 126, 132 and 134 are spaced apart and separated from the depressed surfaces 128, 130 and 136 by the non-depressed surface 124. The depressed surfaces 130 and 136 are spaced apart and separated by the depressed surface 128, and the depressed surfaces 132 and 134 are spaced apart and separated by the depressed surface 126.

The exemplary terminal clips 106 and 108 shown in FIG. 1 are substantially identical in construction but reversed 180° when applied to the first core piece 110 and hence extend as mirror images of one another. The terminal clips 106 and 108 of the component 100 each respectively include mounting sections 140, generally flat and planar bottom sections 142, and coil sections 144 extending on opposing ends of the bottom sections 142 from the mounting sections 140. An upright locating tab section 145 also extends generally perpendicularly to the bottom section 142 in each clip 106 and 108. The locating tab sections are shaped and dimensioned to be received in the depressed surfaces 123, 125 in the side walls 116 and 118 of the first core piece 110.

In the illustrated embodiment, the mounting sections 140 extend in a generally coplanar relationship to the coil sections 144 and are offset or spaced from the plane of the bottom sections 142. The clips 106, 108 are assembled to the core piece 110 with the bottom sections 142 abutting the depressed surfaces 126 and 128, the coil sections 144 abutting the depressed surfaces 130 and 132, and the mounting sections 140 abutting the depressed surfaces 134 and 136. As also shown in FIGS. 1 and 2, the coil ends 150 and 152 are extended through the through holes 146 in the coil sections 144 of the terminal clips 106, 108, where they may be soldered, welded or otherwise attached to ensure electrical connection between the coil ends 150, 152 and the coil 104. Because the coil ends 150, 152 are located on recessed surfaces on the base wall 114 of the core piece 110, however, they do not protrude from the overall exterior surface of the core piece 110 and are less prone to undesirable separation as the component 100 is being handled.

The terminal clips 106, 108 and all the sections thereof as described can be manufactured in a relatively straightforward manner by cutting, bending, or otherwise shaping the clips 106 and 108 from a conductive material. In one exemplary embodiment, the terminals are stamped from a plated sheet of copper and bent into final form, although other materials and formation techniques may alternatively be utilized. The clips 106, 108 may be pre-formed and assembled to the core piece 110 at a later stage of production.

Because the core piece 110 is pressed around the coil 104, electrical connections between the coil ends 150, 152 and the terminal clips 106, 108 are located exterior to the core structure. As shown in FIG. 3, when the component 100 is mounted to the circuit board 180 the base wall 114 of the first core piece 110 faces and abuts the board surface 184 and the flat and planar bottom sections 142 of each terminal clip 106, 108 is electrically connected to the conductive traces 182 on the board 180 via soldering techniques or other techniques known in the art. The coil sections 144 of each clip 106, 108 each face the circuit board 180 and the electrical connections between the coil ends 150, 152 and the coil sections 144 of the clips are substantially protected beneath the core structure. The clips 106 and 108 facilitate secure and reliable electrical connection of the coil ends 150 and 152 in a relatively simple, efficient and cost effective manufacturing process.

Figure 5:
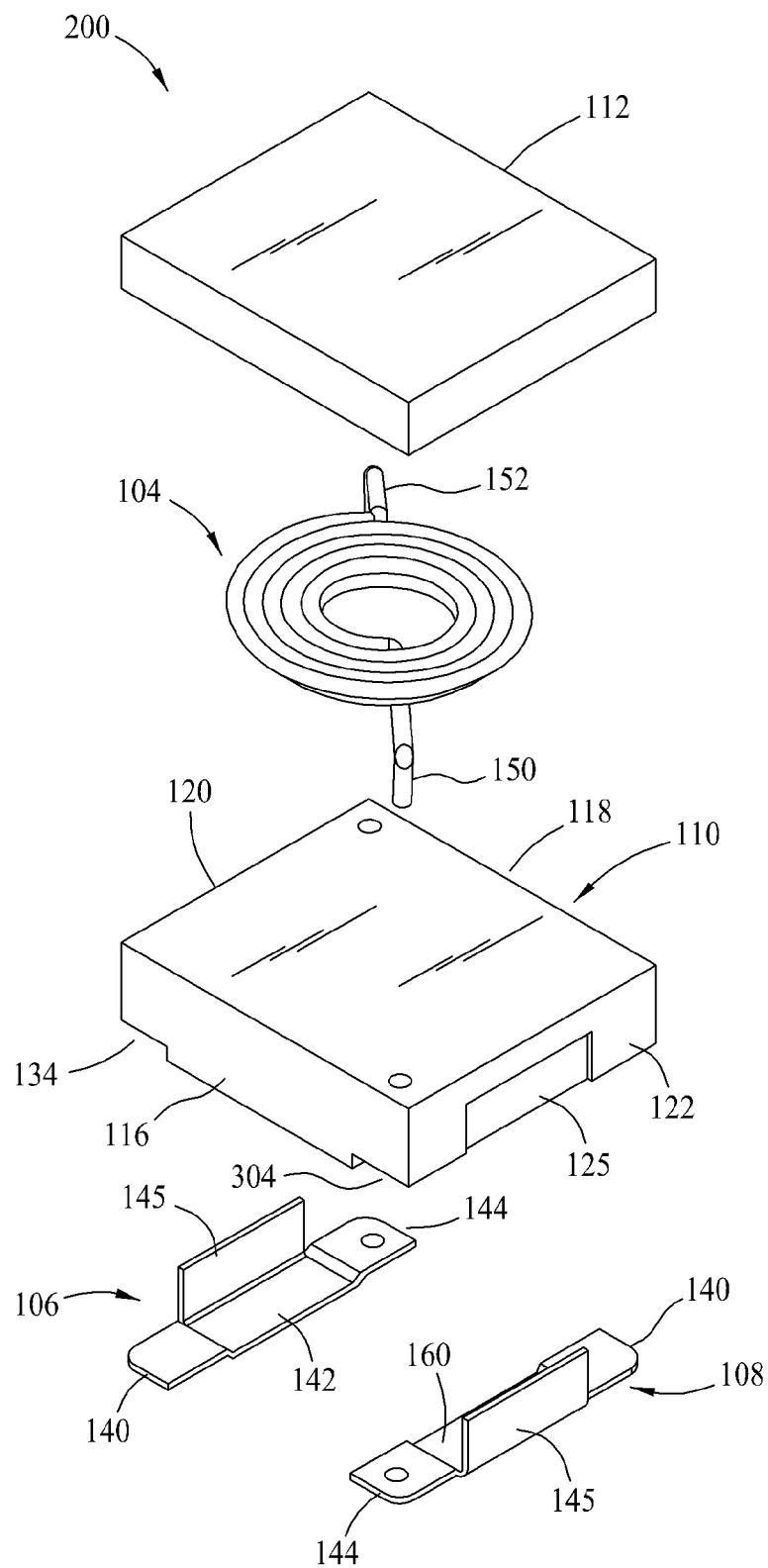
FIG. 5 is a partial exploded view of another exemplary magnetic component according to an exemplary embodiment of the invention.
Figure 6:
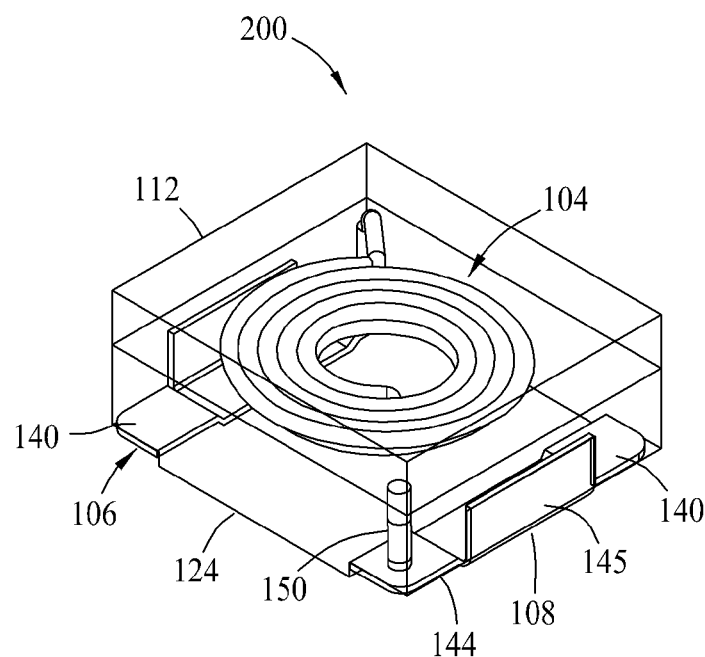
FIG. 6 is a top perspective schematic view of the magnetic component shown in FIG. 5.
Figure 7:
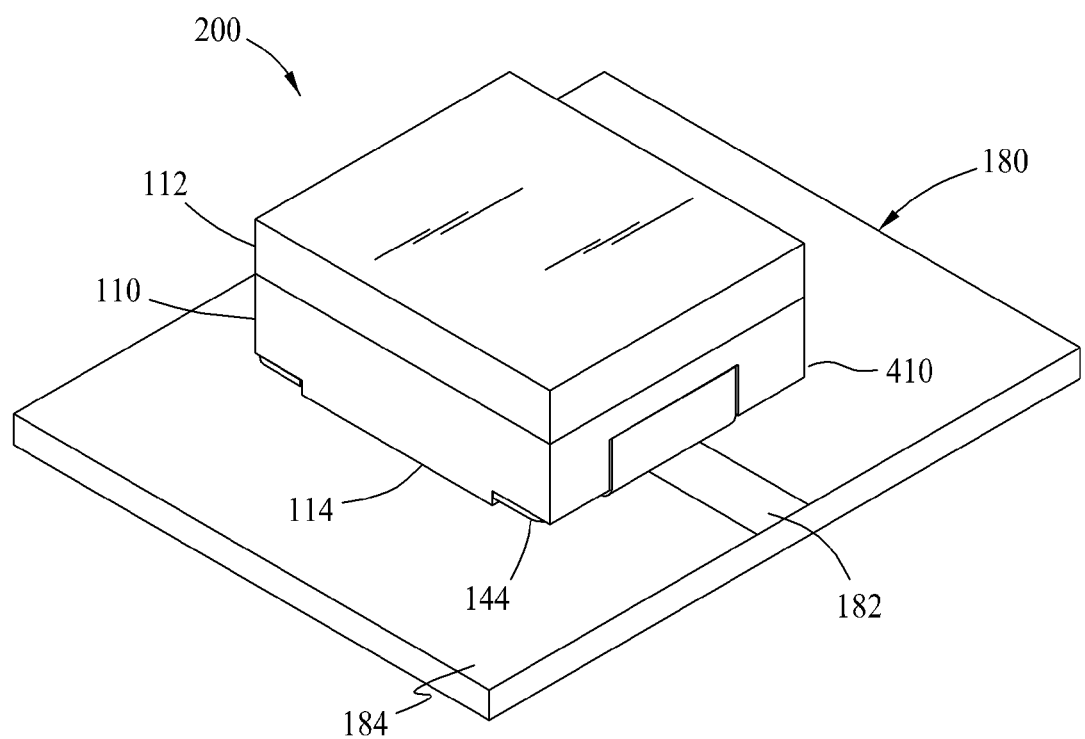
FIG. 7 is a top perspective assembly view of the magnetic component shown in FIG. 5.
Figure 8:
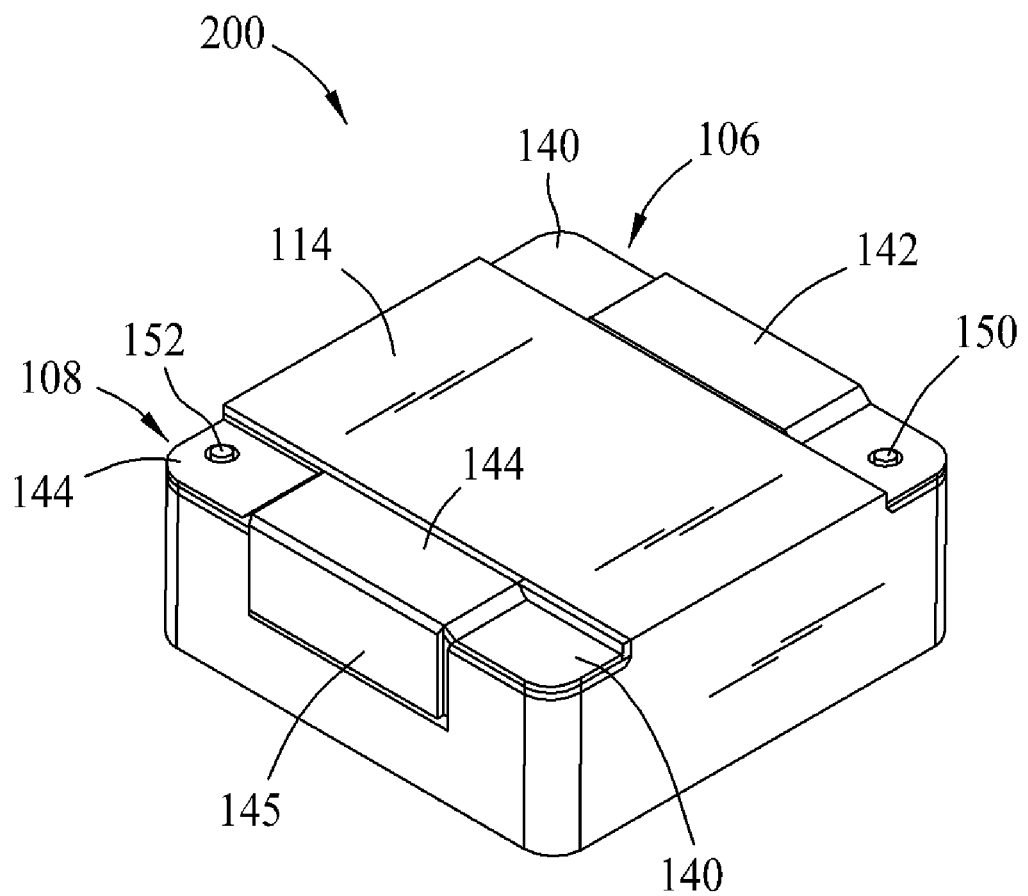
FIG. 8 is a bottom perspective assembly view of the magnetic component shown in FIG. 5.

FIGS. 5-8 are various views of another surface mount magnetic component 200 according to an exemplary embodiment of the invention. FIG. 5 is a partial exploded view of the component 200. FIG. 6 is a top perspective schematic view of the component 200, and FIG. 7 is a top perspective assembly view of the component 200. FIG. 8 is a bottom perspective assembly view of the magnetic component 200.

The component 200 is similar to the component 100, but includes discrete core pieces 110 and 112, with the second core piece 112 being assembled to the first with the coil 104 positioned therebetween. The core piece 110 and 112 may be fabricated from a suitable magnetic material known to those in the art, including but not limited to ferromagnetic materials and ferrimagnetic materials, other materials as described above, and materials known in the art according to known techniques.

Figure 9:
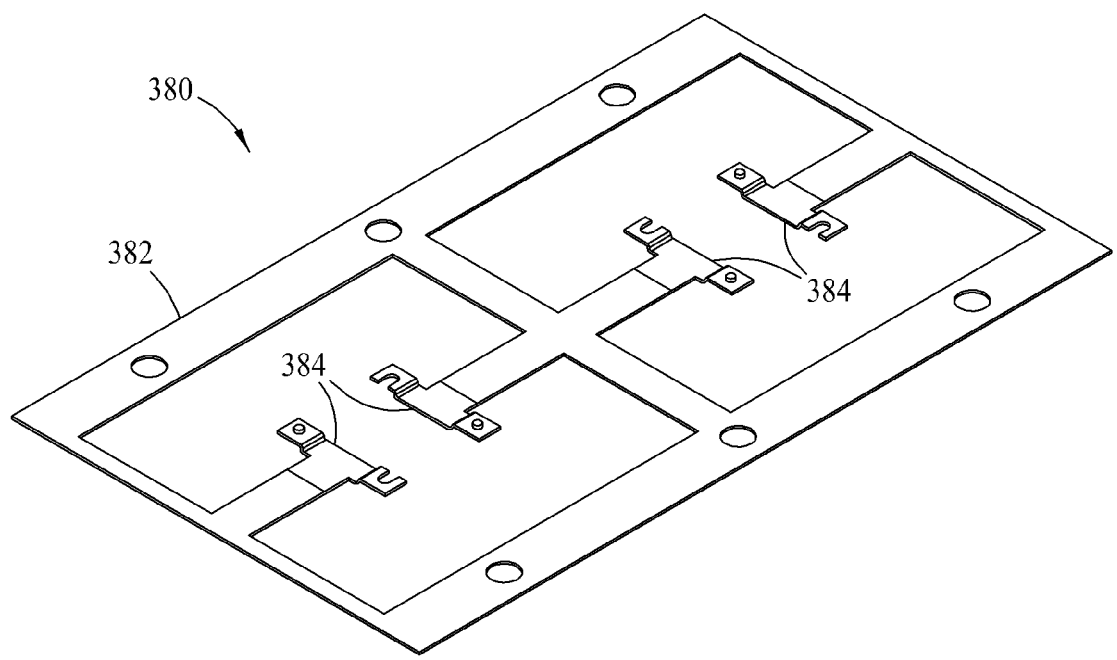
FIG. 9 illustrates a terminal assembly formed in accordance with another embodiment of the present invention.

FIG. 9 partially illustrates a termination technique utilizing a termination fabrication layer 380. The terminal fabrication layer 380 may be fabricated from a conductive material (e.g.

copper) or conductive alloy known in the art according to known techniques. The fabrication layer may be formed to include a lead frame 382 having opposed pairs of terminal clips 384 connected to edges of the lead frame 382. While two pairs of terminal clips 384 are shown, greater or fewer numbers of terminal clips may alternatively be provided. Gaps or spaces are defined between each of the terminal clips 384 in each pair. As explained below, magnetic bodies may be formed in these gaps or spaces.

Figure 10:
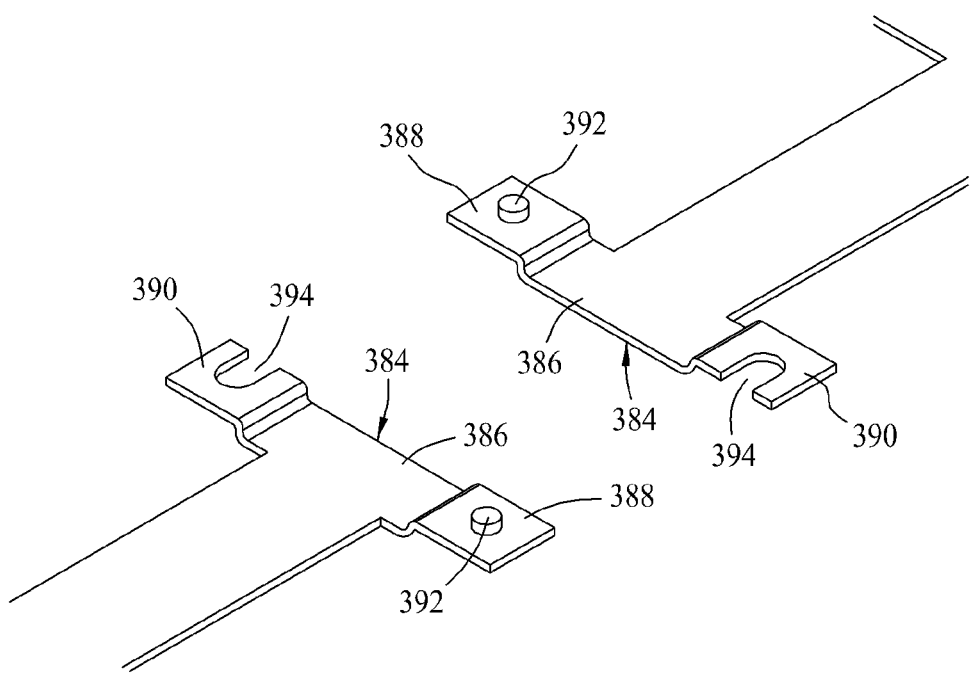
FIG. 10 is a magnified view of a portion of the assembly shown in FIG. 9.

As shown in FIG. 10, and similar to the terminal clips 106 and 108 described above, each terminal clip 384 includes a central portion 386 flanked by offset tabs or ledges 388, 390 extending in a plane spaced from the plane of the central portion 386. While the tabs or ledges 388, 390 appear to be raised from central portion 386 in the perspective shown in FIG. 10, when the clips are turned over the tabs or ledges 388, 390 would be depressed relative to the central portion 386 in a similar manner to the clips 106 and 108 described above. As such, the central portions 386 may be considered the bottom sections 142, and the ledges or tabs 388, 390 may be considered the sections 140 and 144 in the clips 106 and 108 described above.

In an exemplary embodiment, one of the raised ledges 388 in each terminal clip 384 includes a core post 392 and the other of the raised ledges 390 includes a termination slot 394. The respective core posts 392 help secure the clips 384 to a magnetic body, and the termination slot 394 serves as a connection point for a coil lead. While termination slots 394 are provided in one embodiment, through holes may be alternatively be provided in another embodiment to receive coil leads. As shown in FIGS. 9 and 10, the respective pairs of terminal clips 384 are formed as mirror images of each other in one example, although they need not be mirror images in at least some embodiments.

Figure 11A:
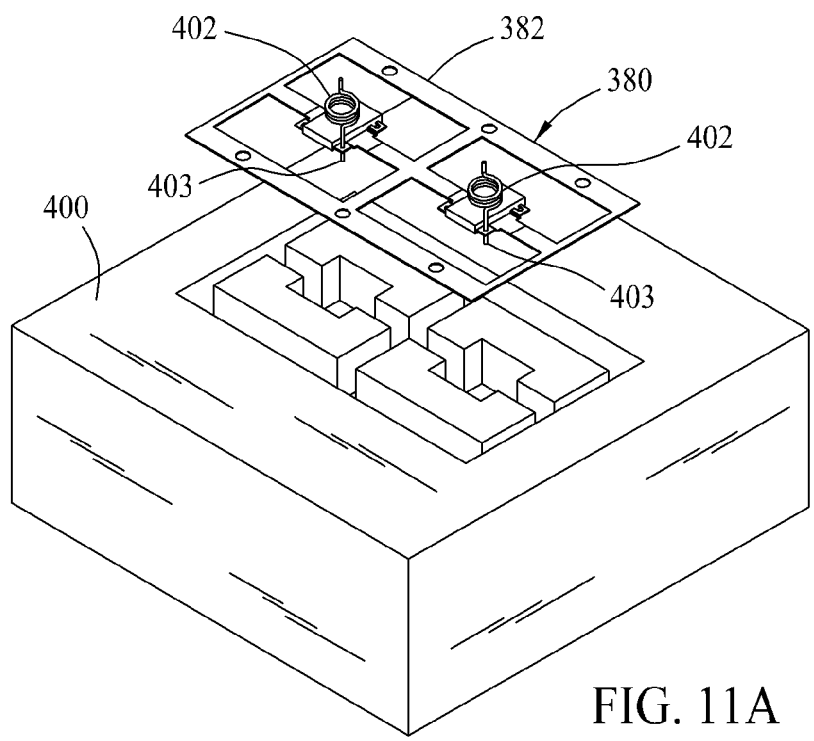
Figure 11B:
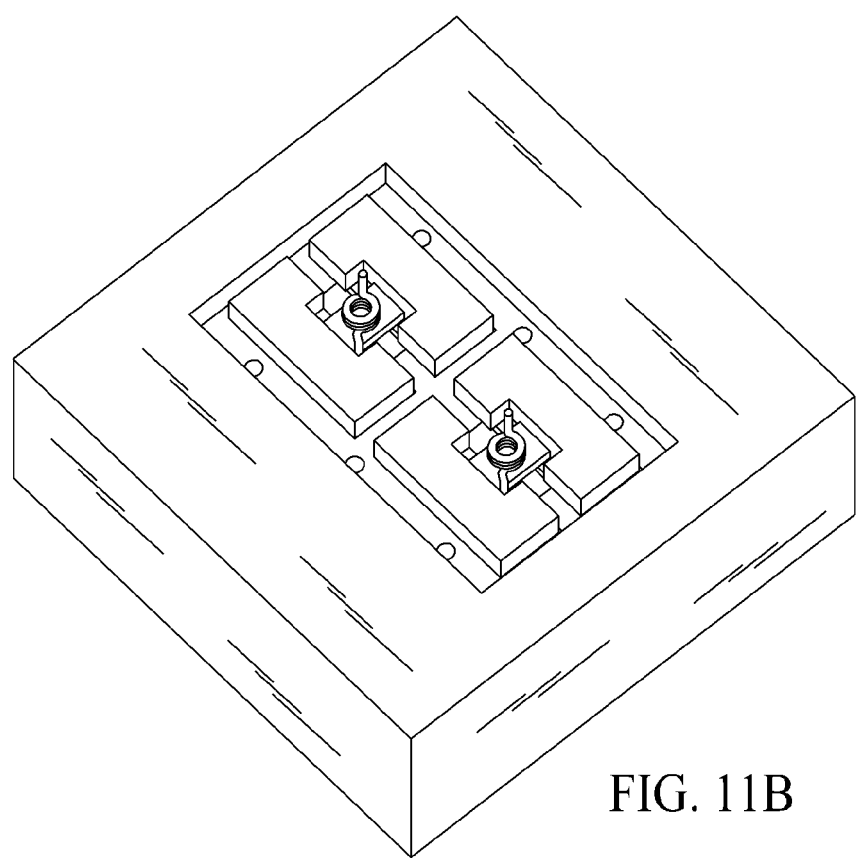
Figure 11C:
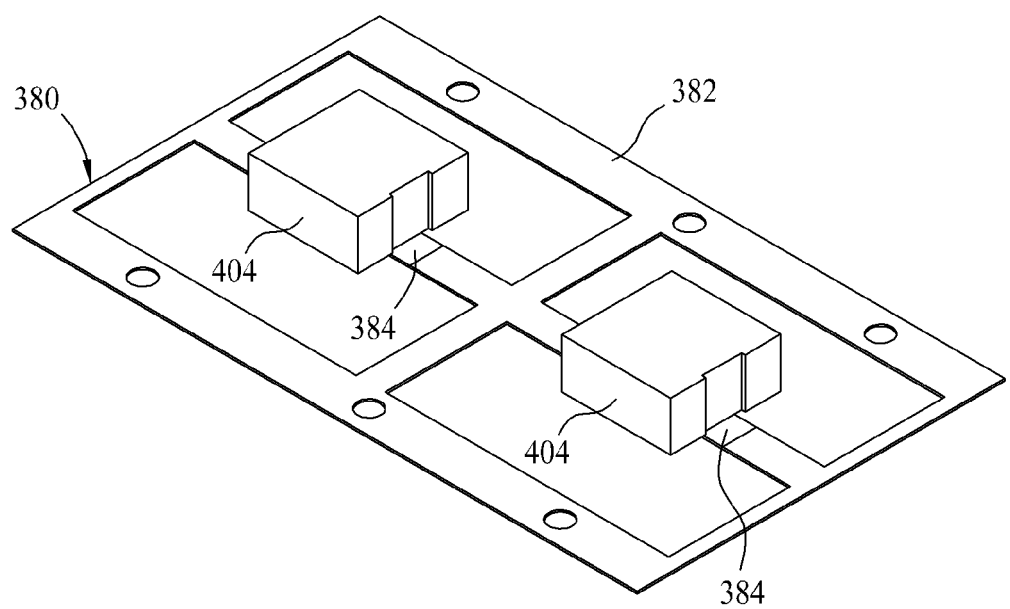
Figure 11D:
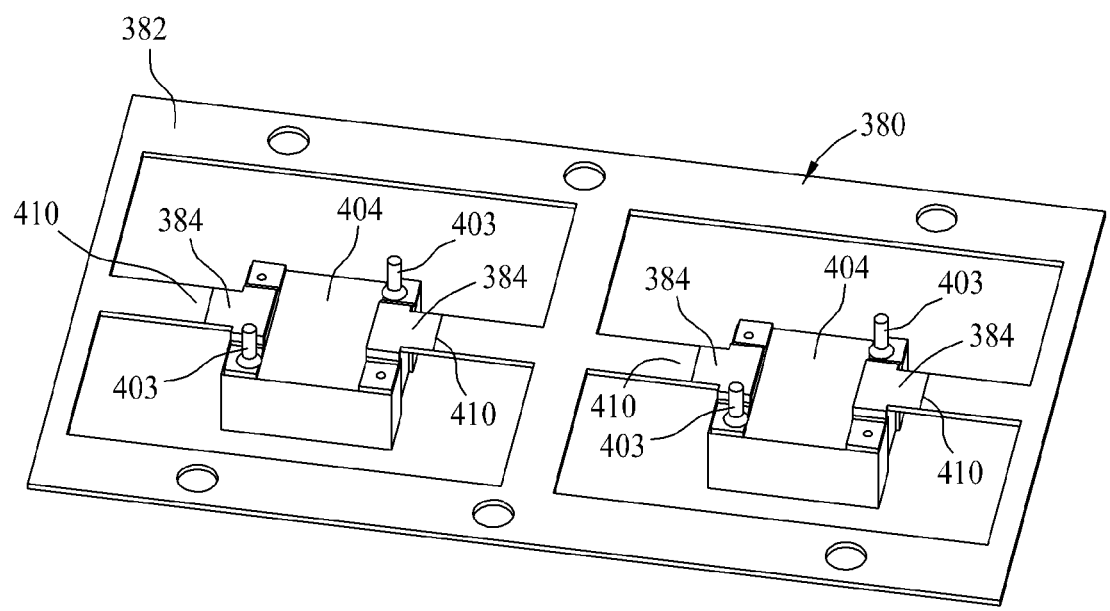

FIGS. 11A through 11H illustrate manufacturing processes utilizing the termination fabrication layer 380 to manufacture a miniaturized magnetic component. As seen in FIG. 11A, the termination fabrication layer 380 may be inserted into a mold 400, and a coil 402 may be provided between each pair of the terminal clips 384 (FIGS. 9 and 10). As also shown in FIG. 11A, the termination slots 394 in each terminal clip 384 receives one of the coil ends 403. Magnetic material, which may be any of the materials described above, may then be applied and pressed around the coils to form magnetic bodies 404 around each coil 402 as shown in FIG. 11B. The core posts 392 (FIG. 10) in the terminal clips 384 are embedded in the magnetic bodies 404 as they are molded. The magnetic bodies 404 and the attached lead frame including the clips 384 may then be removed from the mold 400. FIG. 11C illustrates the resultant assembly in top view and FIG. 11D illustrates the resultant assembly in bottom view.

Figure 11E:
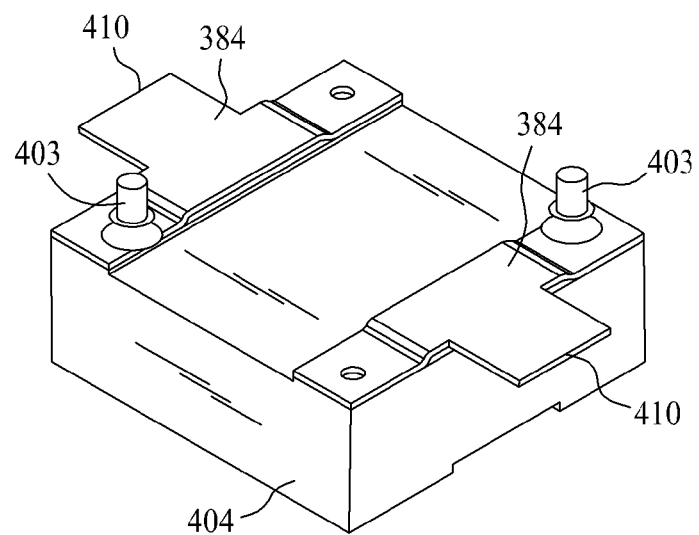
Figure 11F:
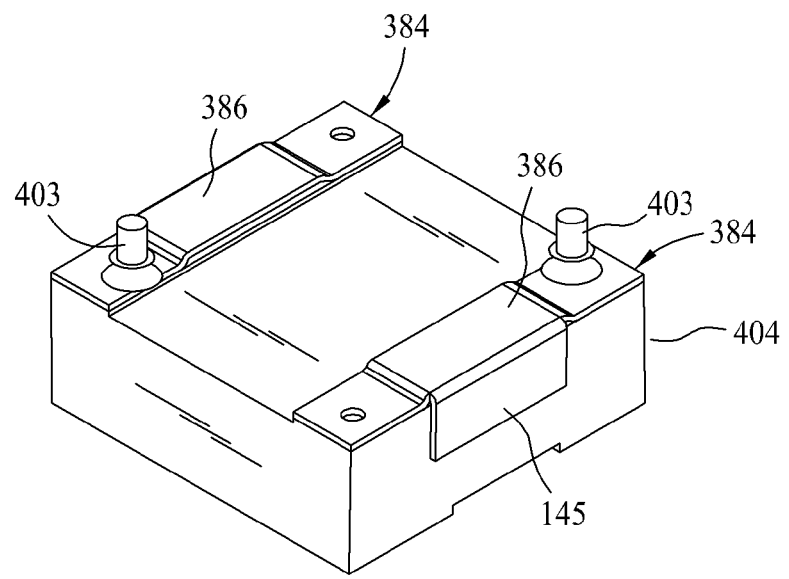

As shown in FIGS. 11D and 11E, the lead frame 382 may be trimmed or severed at a cut lines 384 located a predetermined distance form the lateral edges of the magnetic bodies 404, and a portion of each terminal clip 384 may be bent around a side edge of the magnetic body as shown in FIG. 11F. The portion of the clip 384 is bent at a substantially 90° angle and extend alongside the side wall of the magnetic body. Because the predetermined distance of the cut lines 384 from the magnetic bodies 404 is relatively small, the bent portion of the clips 384 extends only partway up the side of the magnetic bodies 404. That is, a height of the bent portions of the clips 384 is less than the height of the side wall of the magnetic bodies 404.

Figure 11G:
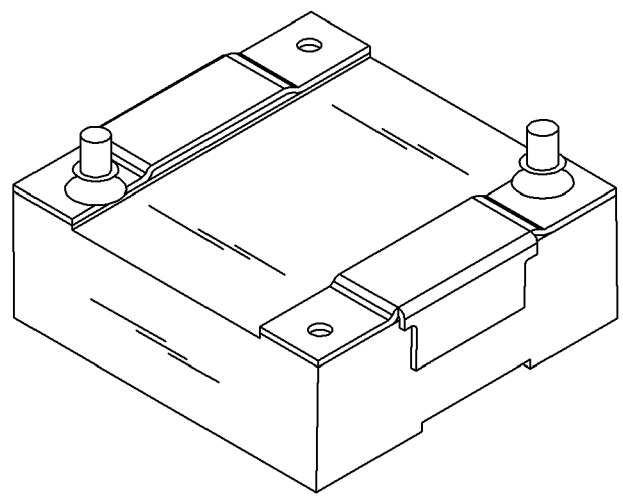

The bent portion of the clips 384 as shown in FIG. 11F may substantially correspond to the locating section 145 described above for the terminal clips 106 and 108. Recesses, similar to the recesses 123 and 125 described in the embodiments above, may be molded into the side walls of the magnetic body to accommodate the bent portions of the terminal clips 384 without negatively affecting the footprint of the magnetic component. The coil ends 403 may be electrically connected to the clips 384 via soldering processes, welding processes, or other techniques familiar to those in the art as shown in FIG. 11G. Soldering may be preferred when relatively large wire gauges are used to fabricate the coils, and welding may be preferred when relatively smaller wire gauges are used to fabricate the coils.

Figure 11H:
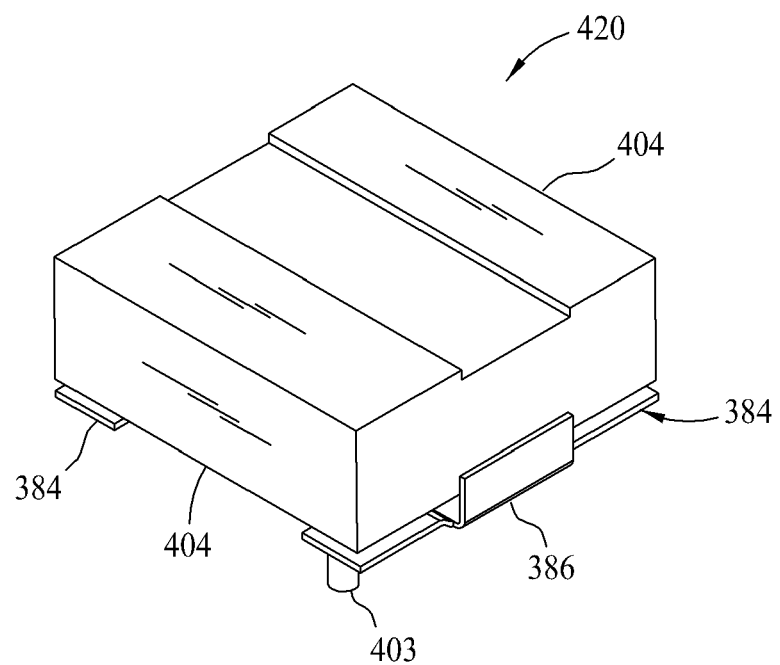

FIG. 11H illustrates a completed magnetic component including the terminal clips 384. Once the magnetic components 420 are completed, they may be surface mounted to a circuit board via the central portions 386 of the clips 384 as described above.

Figure 12:
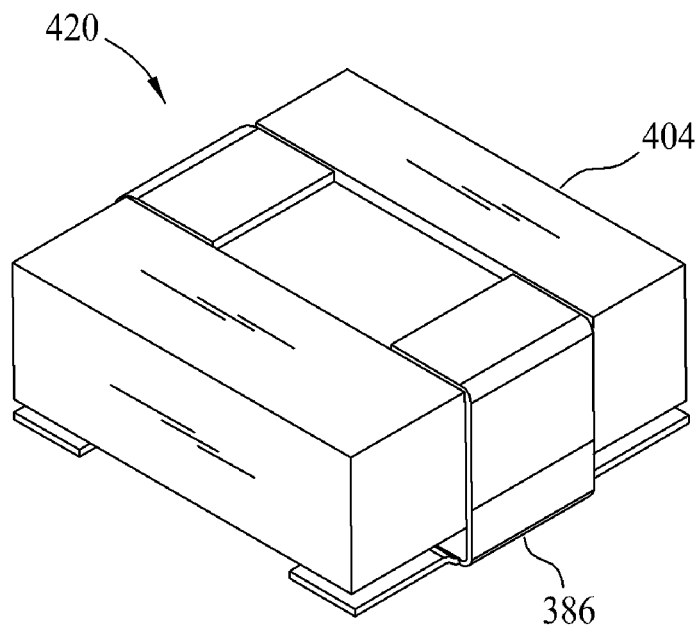
FIG. 12 illustrates another magnetic component.

FIG. 12 illustrates another embodiment of a magnetic component 450 that may be manufactured similar to the methodology described above. In manufacturing the component 450, the cut lines 410 (FIG. 11D) are spaced farther from the magnetic body 404 as the lead frame 382 is trimmed. Thus, when the clips 386 are bent around the magnetic body 404, the trimmed portion of the clip is sufficiently long to extend the entire height of the side wall of the magnetic body 404 and is further bent at about a 90° angle to extend alongside a portion of the top wall of the magnetic body, which may include a recess to accommodate the bent clip without negatively affecting the profile of the component. Spacing the cut line farther away from the magnetic body 404, as in the embodiment of FIG. 12, presents reduced risk of contamination issues and negative effects arising from the molding operations or other manufacturing steps as the magnetic body 404 is formed.

Many variations of the basic methodology described are possible. For example, the coils could be soldered, welded or otherwise connected to the coil ends 403 before the lead frame is trimmed and/or before the clips 386 are bend around the side of the magnetic body. That is, the order of steps as described above is not necessarily required.

Additionally, terminal clips of other shapes may be formed in the lead fabrication layer with similar effect and advantages. That is, the clips need have the precise shapes illustrated and described in other alternative embodiments.

Likewise, in certain embodiments the coils need not be separately provided form the terminal fabrication layer 380 for assembly in molding processes. Rather, the coils may be pre-attached to the fabrication layer or otherwise integrally formed with the terminal fabrication layer in certain embodiments.

Still further, soldering, welding or otherwise electrically connecting the coil ends to the clips could be accomplished in various ways. For example, the slots 394 (FIG. 10) in the clips may be considered optional and through holes, or other mechanical features facilitating engagement of the coil leads may be used instead. As another example, through holes and slots in the clips could be considered optional in some embodiments, and the coil leads 403 could be welded, for example, to surfaces of the clips without utilizing mechanical engagement features. Still further, it is possible to weld or solder the terminal clips to ends of the leads at a location interior to a core piece, as described in U.S. application Ser. No. 12/429,856 filed Apr. 24, 2009, that has been incorporated by reference herein. Also, the coil leads could be soldered or welded to interior facing surfaces of the clips (i.e., a surface facing the magnetic body in the completed component) as well as exterior facing surfaces of the clips (i.e., a surface facing away from the magnetic body in the completed component).

Figure 13:
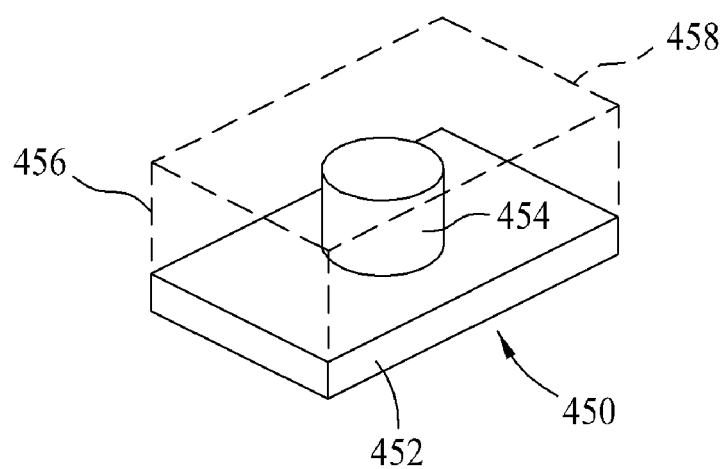
FIG. 13 is a perspective view of a core piece for a magnetic component formed in accordance with an exemplary embodiment.

FIG. 13 is a perspective view of a core piece 450 for a magnetic component formed in accordance with an exemplary embodiment.

In an exemplary embodiment as shown, the core piece 450 is prefabricated from a known material and known techniques such as those described above and provided for assembly with other components at a later stage of manufacture. The core piece 450, as shown in FIG. 13, includes a generally planar and rectangular base portion 452 and a cylindrical or tubular portion 454 extending upwardly and generally perpendicularly from the plane of the base portion 452. The base portion 452 in the exemplary embodiment shown is substantially longer and wider in dimension relative to the diameter of the cylindrical portion 454, and the cylindrical portion 454 is substantially centered on the rectangular base portion 454. The base portion 452 and the cylindrical portion 454 therefore define a receiving area for a coil such as the coil 402 (FIGS. 11A and 11B) or other coil described herein.

Figure 14:
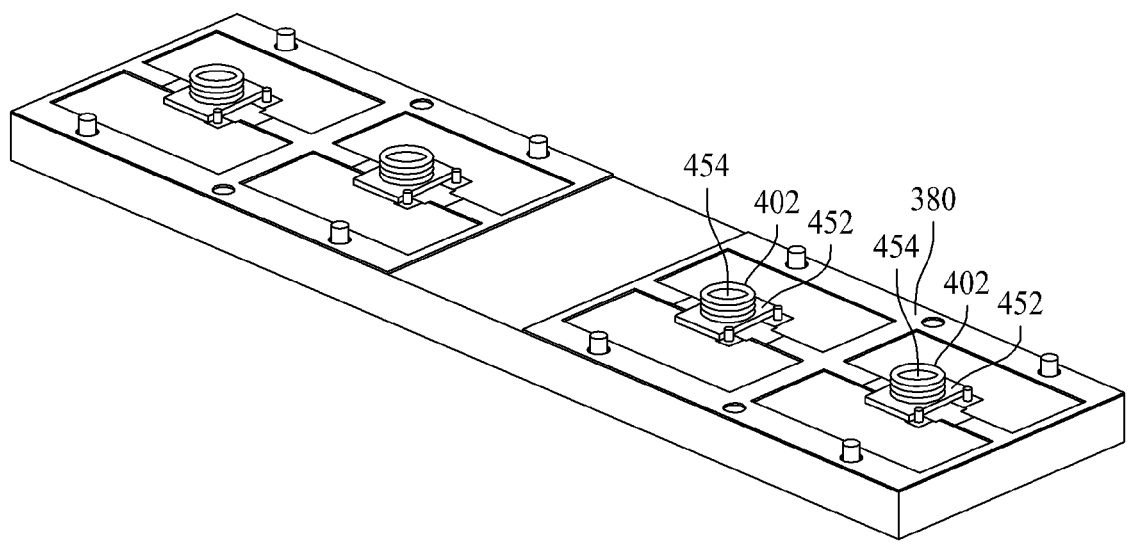
FIG. 14 illustrates a core pieces shown in FIG. 13 assembled with a terminal lead frame in a molding stage of manufacture.

More specifically, and as shown in FIG. 14, the cylindrical portion 454 of the core piece 450 is extended through an open center area of the coil 402 such that the cylindrical portion 454 substantially fills the open center area of the coil 402. The termination fabrication layer 380 is also shown in FIG. 14 with coil termination features described above, with the assembly placed in a mold. When so assembled, the cylindrical portion 454 of each core piece 450 extends through and generally occupies the central opening of each coil. The core pieces 450 may be held in place with a fixture that also secures the termination fabrication layer 380 and attached inductor coils 402 in place for further manufacturing processes.

A magnetic body 458 (shown in FIG. 15 and also in phantom in FIG. 13) may therefore be formed around the coil 402 and magnetic core piece 450 and portions of the termination fabrication layer 380. In one example, an inductor body may then be compression molded over the assembled coils 402, terminal clips of the termination fabrication layer 380 and core pieces 450. The cylindrical portions 454 of the separately provided core pieces 450 prevent the material utilized to form the magnetic body 458 from entering the center area of the core during molding processes. Particularly when the core pieces 450 and the magnetic body 458 are fabricated from different materials having different magnetic properties, considerable performance advantages my result with simplified manufacturing processes. An integral or monolithic core structure may result from the core pieces 450 and magnetic body 458 with varying magnetic properties in different portions of the core structure, while eliminating gapping and bonding steps for separate core pieces associated with conventional magnetic component constructions.

Figure 15:
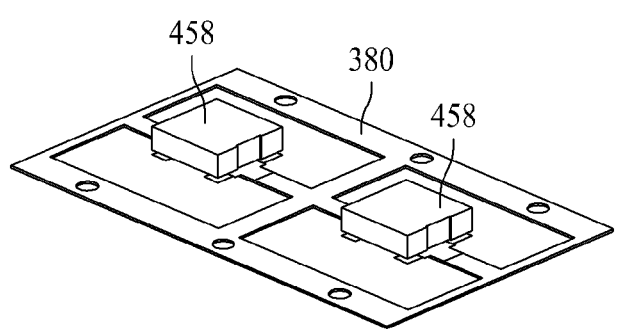
FIG. 15 illustrates a portion of the assembly shown in FIG. 14 after molding processes.

The assembly shown in FIG. 15 after molding processes are complete may be finished in a similar manner to that described above in relation to FIGS. 11D through 11H.

III. EXEMPLARY EMBODIMENTS DISCLOSED

It should now be evident that the various features described may be mixed and matched in various combinations. A great variety of magnetic component assemblies may be advantageously provided having different magnetic properties, different numbers and types of coils, and having different performance characteristics to meet the needs of specific applications.

Also, certain of the features described could be advantageously utilized in structures having discrete core pieces that are physically gapped and spaced from another.

Among the various possibilities within the scope of the disclosure as set forth above, at least the following embodiments are believed to be advantageous relative to conventional inductor components.

A surface mount magnetic component assembly has been disclosed including: a conductive coil having a winding portion and opposed first and second distal ends extending from the winding portion; a magnetic core formed around and enclosing the winding portion, the magnetic core having a base wall and orthogonal side walls extending from the base wall, the first and second distal ends extending through the base wall of the magnetic core; and first and second terminal clips connected to the respective first and second distal ends, the first and second terminal clips located on the base wall adjacent opposing side walls of the magnetic core.

Optionally, the first and second terminal clips extend entirely exterior to the magnetic core. The first and second terminal clips may include one of an opening and a slot configured to receive one of the first and second distal ends. The first and second distal ends may extend through spaced apart recessed surfaces on the base wall of the magnetic core. The distal ends may be connected to the first and second terminal clips at the recessed surfaces. At least one of the first and second terminal clips may include a post embedded in the core. The first and second terminal clips may be provided on a termination fabrication layer.

The magnetic component assembly may further include a separately fabricated core piece within the magnetic core. The winding portion may have an open center area, with a portion of the separately fabricated core piece occupying the open center area. The portion of the separately fabricated core piece may be cylindrical. The separately provided core piece may also include a rectangular base portion and a cylindrical portion extending from the base portion. The separately provided core piece may be fabricated from a different magnetic material than the magnetic core.

The magnetic component assembly may further include a circuit board, with the base wall resting on the circuit board. The magnetic body and coil may form an inductor.

A method of manufacturing a magnetic component has also been disclosed including: forming a magnetic body over exposed surfaces of a pair of terminal clips and at least one coil associated with the pair of terminal clips; whereby a winding portion of the coil is completely embedded in the magnetic body and opposed distal ends of the coil are attached to the terminal clips on a common wall of the formed magnetic body.

Optionally, the method may further include: assembling a separately provided core piece with the coil; and forming a magnetic body over the assembly of the separately provided core piece and the coil. Assembling the provided core piece with the coil may include extending a portion of the separately provided core piece through an open center area of the coil. The terminal clips may include at least one post, with the method further comprising embedding the post in the magnetic body as the magnetic body is formed. The pair of terminal clips may also be attached to a lead frame, with the method further comprising trimming the lead frame to sever the clips from the lead frame.

The method may also include bending a portion of the clip around a side wall of the magnetic body, and electrically connecting the terminal clip to the coil end. Electrically connecting the terminal clip may include welding or soldering the coil end to the clip. Electrically connecting the terminal clip may also include receiving the coil end in one of a through hole or terminal slot, and attaching an exposed coil end on the bottom surface of the magnetic body to the clip.

Forming the body comprises molding the body over the at least one clip. The pair of terminal clips may be joined by a lead frame with a gap between the pair of clips, and the magnetic body being formed in the gap between the pair of terminal clips.

Each terminal clip may include a central portion and first and second depressed portions on either side of the central portion, and the method may further include connecting the coil to one of the depressed portions. The method may also include arranging the pair of terminal clips to extend as mirror images of one another.

IV. CONCLUSION

The benefits of the invention are now believed to be evident from the foregoing examples and embodiments. While numerous embodiments and examples have been specifically described, other examples and embodiments are possible within the scope and spirit of the exemplary devices, assemblies, and methodology disclosed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A surface mount magnetic component assembly comprising:
   a conductive coil having a winding portion and opposed first and second distal ends extending from the winding portion;
   a magnetic core formed around and enclosing the winding portion, the magnetic core having a base wall and orthogonal side walls extending from the base wall, the first and second distal ends extending through the base wall of the magnetic core; and
   first and second terminal clips separately fabricated from the conductive coil, the first and second terminal clips connected to the respective first and second distal ends of the conductive coil, the first and second terminal clips respectively located on the base wall adjacent opposing ones of the side walls of the magnetic core,
   wherein at least one of the first and second terminal clips includes a central portion extending in a first plane, the central portion being flanked by offset ledges extending in a second plane spaced from but generally parallel to the first plane.

2. The magnetic component assembly of claim 1, wherein the first and second terminal clips extend entirely exterior to the magnetic core.

3. The magnetic component assembly of claim 1, wherein the first and second terminal clips include one of an opening and a slot configured to receive one of the first and second distal ends.

4. The magnetic component assembly of claim 1, wherein the first and second distal ends extend through spaced apart recessed surfaces on the base wall of the magnetic core.

5. The magnetic component assembly of claim 4, wherein the distal ends are connected to the first and second terminal clips at the recessed surfaces.

6. The magnetic component assembly of claim 1, wherein at least one of the first and second terminal clips includes a post embedded in the core.

7. The magnetic component assembly of claim 1, wherein the first and second terminal clips are provided on a termination fabrication layer.

8. The magnetic component assembly of claim 1, further comprising a separately fabricated core piece within the magnetic core.

9. The magnetic component assembly of claim 8, wherein the winding portion has an open center area, a portion of the separately fabricated core piece occupying the open center area.

10. The magnetic component assembly of claim 9, wherein the portion of the separately fabricated core piece is cylindrical.

11. The magnetic component assembly of claim 8, wherein the separately provided core piece comprises a rectangular base portion and a cylindrical portion extending from the base portion.

12. The magnetic component assembly of claim 8, wherein the separately provided core piece is fabricated from a different magnetic material than the magnetic core.

13. The magnetic component assembly of claim 1, further comprising a circuit board, the base wall resting on the circuit board.

14. The magnetic component assembly of claim 1, wherein the magnetic body and coil form an inductor.

15. The magnetic component assembly of claim 1, wherein one of the offset ledges includes a core post.

16. The magnetic component assembly of claim 1, wherein one of the offset ledges includes a termination slot.

17. The magnetic component assembly of claim 1, wherein one of the offset ledges includes a core post, and the other of the offset ledges includes a termination slot.

18. The magnetic component assembly of claim 1, wherein the base wall is formed with a non-depressed surface, and a first depressed surface for abutment with the central portion of the terminal clip.

19. The magnetic component assembly of claim 18, wherein the base wall further is formed with a second depressed surface adjacent the first depressed surface, and the second surface abuts the offsets ledges of the terminal clip.

20. The magnetic component assembly of claim 1, wherein the at least one of the first and second terminal clips further comprises a bent portion extending substantially perpendicular to the first plane.

21. The magnetic component assembly of claim 1, wherein one of the first and second distal ends of the coil are attached to one of the offset ledges in the at least one terminal clip.

22. The magnetic component of claim 21, wherein the one of the offset ledges includes a termination slot serving as a connection point for the coil lead.

23. The magnetic component of claim 1, wherein the first and second terminal clips are substantially identically formed.

24. The magnetic component of claim 1, wherein the first and second terminal clips are arranged on the magnetic core as mirror images of one another.

25. The magnetic component of claim 1, wherein the magnetic core is molded around the winding portion.

26. The magnetic component of claim 1, wherein the central portion of the terminal clip defines a surface mount area for mounting to a circuit board.

* * * * *